US012609712B2

(12) United States Patent
Hung

(10) Patent No.: US 12,609,712 B2
(45) Date of Patent: Apr. 21, 2026

(54) ANALOG-TO-DIGITAL CONVERSION IN ACCORDANCE WITH A DISTRIBUTION OF RESULTS OF AN ANALOG COMPUTE-IN-MEMORY

(71) Applicant: MACRONIX INTERNATIONAL CO., LTD., Hsinchu (TW)

(72) Inventor: Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 105 days.

(21) Appl. No.: 18/741,108

(22) Filed: Jun. 12, 2024

(65) Prior Publication Data

US 2025/0385684 A1     Dec. 18, 2025

(51) Int. Cl.
*H03M 1/12*       (2006.01)
*H03M 1/10*       (2006.01)
*H03M 1/38*       (2006.01)

(52) U.S. Cl.
CPC ......... *H03M 1/1085* (2013.01); *H03M 1/125* (2013.01); *H03M 1/38* (2013.01)

(58) Field of Classification Search
CPC ......... H03M 1/1085; H03M 1/38; H03M 1/12
USPC ............................... 341/155, 106, 50, 51, 67
See application file for complete search history.

(56) References Cited

U.S. PATENT DOCUMENTS

| 2022/0414443 | A1* | 12/2022 | Li | ........................... | G06J 1/005 |
| 2022/0414444 | A1* | 12/2022 | Li | ........................... | H03M 1/36 |
| 2023/0244901 | A1* | 8/2023 | Trivedi | .............. | G11C 29/028 |
| | | | | | 706/15 |
| 2024/0020197 | A1* | 1/2024 | Wu | ....................... | G06F 11/076 |
| 2024/0274170 | A1 | 8/2024 | Hung et al. | | |

FOREIGN PATENT DOCUMENTS

TW         I828590  B      1/2024

* cited by examiner

*Primary Examiner* — Peguy Jean Pierre
(74) *Attorney, Agent, or Firm* — Korbin S Van Dyke; Haynes Beffel & Wolfeld LLP

(57)          ABSTRACT

An analog-to-digital converter system includes an analog compute-in-memory and transform circuitry. The transform circuitry is (i) configured to receive one or more codes from corresponding one or more analog-to-digital converters of the analog compute-in-memory, (ii) configured to provide, responsive to receipt of the one or more codes, one or more transformed codes to digital circuitry configured to perform one or more digital operations on the one or more transformed codes, and (iii) configured to determine the one or more transformed codes in accordance with a distribution of results of the analog compute-in-memory.

20 Claims, 7 Drawing Sheets

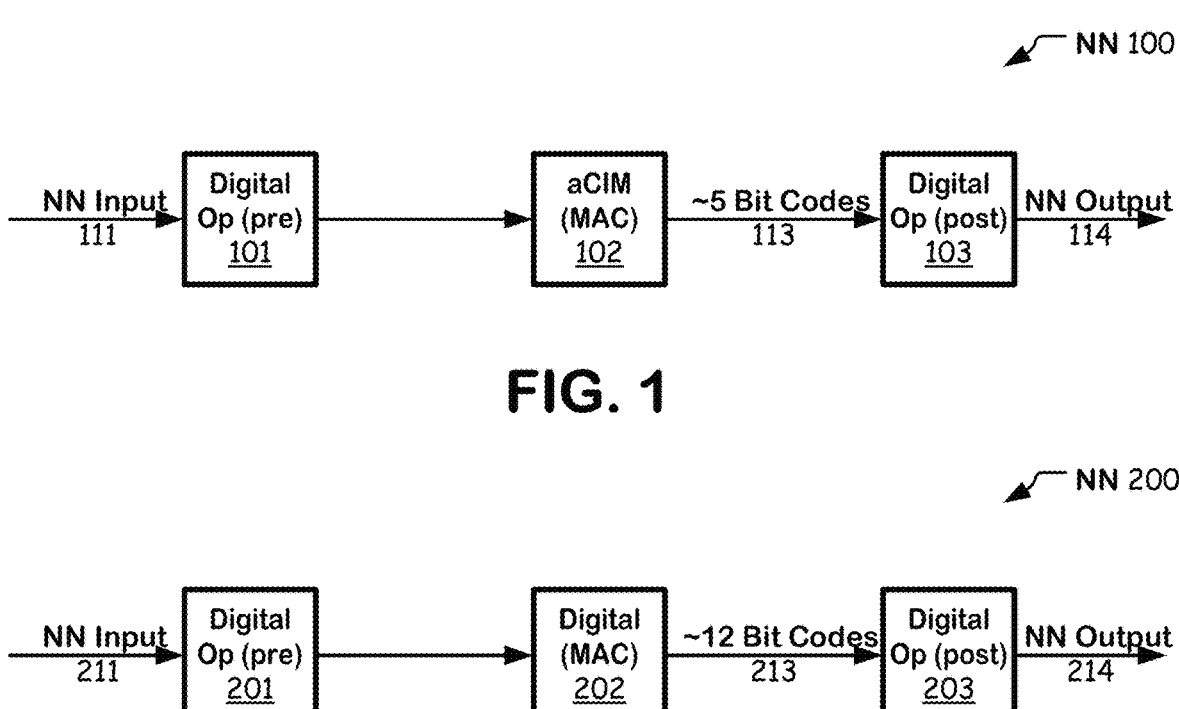
FIG. 1
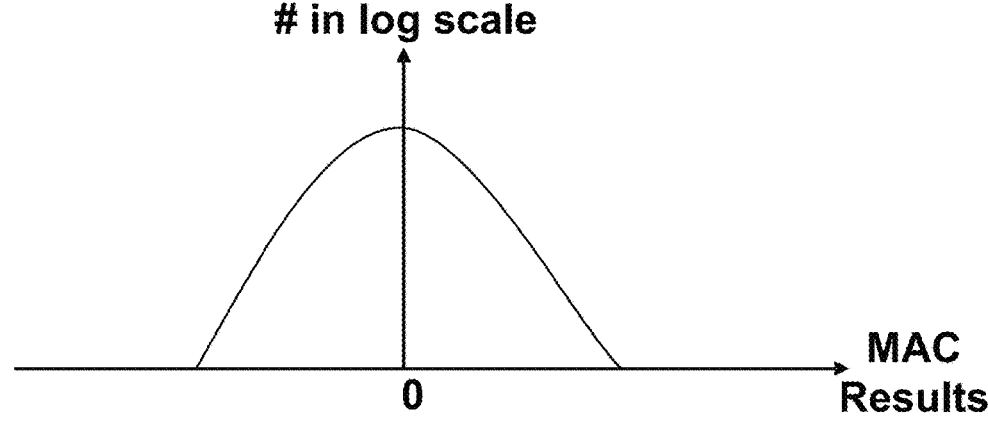
FIG. 2
FIG. 3

| 5-bit Value 901 | 5-bit ADC Code 902 | | | | | 12-bit Transformed Code 903 | | | | | | 12-bit Value 904 |
|---|---|---|---|---|---|---|---|---|---|---|---|---|
| 0 | 0 | 0 | 0 | 0 | 0 | 0000 | 0000 | 0 | 0 | 0 | 0 | 0 |
| 1 | 0 | 0 | 0 | 0 | 1 | 0000 | 0000 | 0 | 0 | 0 | 1 | 1 |
| 2 | 0 | 0 | 0 | 1 | 0 | 0000 | 0000 | 0 | 0 | 1 | 0 | 2 |
| 3 | 0 | 0 | 0 | 1 | 1 | 0000 | 0000 | 0 | 0 | 1 | 1 | 3 |
| 4 | 0 | 0 | 1 | 0 | 0 | 0000 | 0000 | 0 | 1 | 0 | 0 | 4 |
| 5 | 0 | 0 | 1 | 0 | 1 | 0000 | 0000 | 0 | 1 | 0 | 1 | 5 |
| 6 | 0 | 0 | 1 | 1 | 0 | 0000 | 0000 | 0 | 1 | 1 | 0 | 6 |
| 7 | 0 | 0 | 1 | 1 | 1 | 0000 | 0000 | 0 | 1 | 1 | 1 | 7 |
| 8 | 0 | 1 | 0 | 0 | 0 | 0000 | 0000 | 1 | 0 | 0 | 0 | 8 |
| 9 | 0 | 1 | 0 | 0 | 1 | 0000 | 0000 | 1 | 0 | 0 | 1 | 9 |
| 10 | 0 | 1 | 0 | 1 | 0 | 0000 | 0000 | 1 | 0 | 1 | 0 | 10 |
| 11 | 0 | 1 | 0 | 1 | 1 | 0000 | 0000 | 1 | 0 | 1 | 1 | 11 |
| 12 | 0 | 1 | 1 | 0 | 0 | 0000 | 0000 | 1 | 1 | 0 | 0 | 12 |
| 13 | 0 | 1 | 1 | 0 | 1 | 0000 | 0000 | 1 | 1 | 0 | 1 | 13 |
| 14 | 0 | 1 | 1 | 1 | 0 | 0000 | 0000 | 1 | 1 | 1 | 0 | 14 |
| 15 | 0 | 1 | 1 | 1 | 1 | 0000 | 0000 | 1 | 1 | 1 | 1 | 15 |
| 16 | 1 | 0 | 0 | 0 | 0 | 0000 | 0001 | 0 | 0 | 0 | 0 | 16 |
| 17 | 1 | 0 | 0 | 0 | 1 | 0000 | 0001 | 0 | 0 | 0 | 1 | 17 |
| 18 | 1 | 0 | 0 | 1 | 0 | 0000 | 0001 | 0 | 0 | 1 | 0 | 18 |
| 19 | 1 | 0 | 0 | 1 | 1 | 0000 | 0001 | 0 | 0 | 1 | 1 | 19 |
| 20 | 1 | 0 | 1 | 0 | 0 | 0000 | 0001 | 0 | 1 | 0 | 0 | 20 |
| 21 | 1 | 0 | 1 | 0 | 1 | 0000 | 0001 | 0 | 1 | 0 | 1 | 21 |
| 22 | 1 | 0 | 1 | 1 | 0 | 0000 | 0001 | 0 | 1 | 1 | 0 | 22 |
| 23 | 1 | 0 | 1 | 1 | 1 | 0000 | 0001 | 0 | 1 | 1 | 1 | 23 |
| 24 | 1 | 1 | 0 | 0 | 0 | 0000 | 0001 | 1 | 0 | 0 | 0 | 24 |
| 25 | 1 | 1 | 0 | 0 | 1 | 0000 | 0010 | 0 | 0 | 0 | 0 | 32 |
| 26 | 1 | 1 | 0 | 1 | 0 | 0000 | 0100 | 0 | 0 | 0 | 0 | 64 |
| 27 | 1 | 1 | 0 | 1 | 1 | 0000 | 1000 | 0 | 0 | 0 | 0 | 128 |
| 28 | 1 | 1 | 1 | 0 | 0 | 0001 | 0000 | 0 | 0 | 0 | 0 | 256 |
| 29 | 1 | 1 | 1 | 0 | 1 | 0010 | 0000 | 0 | 0 | 0 | 0 | 512 |
| 30 | 1 | 1 | 1 | 1 | 0 | 0100 | 0000 | 0 | 0 | 0 | 0 | 1024 |
| 31 | 1 | 1 | 1 | 1 | 1 | 1000 | 0000 | 0 | 0 | 0 | 0 | 2048 |

Linear 910 (rows 0–24)

Dichotomous 920 (rows 25–31)

FIG. 9

ANALOG-TO-DIGITAL CONVERSION IN ACCORDANCE WITH A DISTRIBUTION OF RESULTS OF AN ANALOG COMPUTE-IN-MEMORY

BACKGROUND

Field

The present disclosure relates to analog-to-digital converters (ADCs) such as those used in an analog compute in memory (CIM) structure. More specifically, the present disclosure relates to an analog CIM (aCIM) structure for performing multiply accumulate calculation (MAC) operations such as used in layers of a neural network (NN).

Description of Related Art

In-memory computing components that perform aCIM operations implement thousands of individual local sensing circuits to determine values of analog currents and/or analog voltages on bit lines of a compute-enabled memory array. The local sensing circuits convert the analog values to one or more digital signals (e.g., via one or more ADCs) compatible with use by digital circuitry that follows the compute-enabled memory array in a processing flow. An example processing flow is an implementation of a layer of an NN, with the compute-enabled memory array performing a MAC operation.

SUMMARY

A problem with the in-memory computing components that perform aCIM operations is that the conversion of the analog values to one or more digital signals provides a limited code length (e.g., five bits) that has a relatively low resolution, such as compared to the digital circuitry. Therefore, it is desirable to provide an effectively longer code length.

The technology disclosed enables techniques for dichotomous ADCs. The dichotomous ADCs enable effectively longer code lengths, with improved resolution, such as with respect to MAC results that frequently occur.

A system of one or more computers is configurable to perform particular operations or actions by virtue of having software, firmware, hardware, or a combination of them installed on the system that in operation causes or cause the system to perform the actions. One or more computer programs are configurable to perform particular operations or actions by virtue of including instructions that, when executed by data processing apparatus, cause the apparatus to perform the actions.

A first aspect includes an analog-to-digital converter system (e.g., a dichotomous analog-to-digital converter system). The analog-to-digital converter system includes an analog compute-in-memory; and transform circuitry, where the transform circuitry is (i) configured to receive one or more codes from corresponding one or more analog-to-digital converters of the analog compute-in-memory, (ii) configured to provide, responsive to receipt of the one or more codes, one or more transformed codes to digital circuitry configured to perform one or more digital operations on the one or more transformed codes, and (iii) configured to determine the one or more transformed codes in accordance with a distribution of results of the analog compute-in-memory. Variations of this aspect include corresponding computer systems, apparatus, and computer programs recorded on one or more computer storage devices, each configured to perform the actions of the methods.

Aspects optionally include one or more of the following features. The determining of the one or more transformed codes is in accordance with at least a first type of linear transformation and a dichotomous transformation. The at least a first type of linear transformation is used for a first portion of the one or more codes; the dichotomous transformation is used for a second portion of the one or more codes; the first and the second portions of the one or more codes are non-overlapping; and values of the first portion of the one or more codes are less than values of the second portion of the one or more codes. The determining of the one or more transformed codes is in accordance with the at least a first type of linear transformation and at least a second type of linear transformation, which is different than the first type of linear transformation. The analog compute-in-memory is configured to store a plurality of weights and to compute a multiply accumulate calculation based on one or more activation inputs and the stored plurality of weights. The transform circuitry optionally includes a look-up table. The transform circuitry optionally includes logic gates. The determining of the one or more transformed codes in accordance with the distribution of the results of the analog compute-in-memory is performed such that the distribution of results is arranged so that approximately equal numbers of specific results of the analog compute-in-memory are represented by each of the one or more transformed codes. The one or more codes are each of a first length; the one or more transformed codes are each of a second length; and the first length is less than the second length. The determining the one or more transformed codes is in accordance with first a linear transformation such that a distance between adjacent discrete points of a first number system corresponding to the one or more codes corresponds to a distance between adjacent discrete points of a second number system corresponding to the one or more transformed codes. The determining the one or more transformed codes is further in accordance with a second linear transformation such that the distance between adjacent discrete points of the first number system corresponds to twice the distance between adjacent discrete points of the second number system. The determining the one or more transformed codes is further in accordance with a third linear transformation such that the distance between adjacent discrete points of the first number system corresponds to four times the distance between adjacent discrete points of the second number system. The determining the one or more transformed codes is further in accordance with a dichotomous transformation such that each unit in the one or more codes corresponds to respective exponential steps in the one or more transformed codes. Implementations of the described techniques optionally include hardware, a method or process, and/or computer software on a computer-accessible medium.

A second aspect includes receiving a code from an analog-to-digital converter of an analog compute-in-memory; transforming the received code into a transformed code, and where the transforming is in accordance with a distribution of results of the analog compute-in-memory. Variations of this aspect include corresponding computer systems, apparatus, and computer programs recorded on one or more computer storage devices, each configured to perform actions of the aspects.

Aspects optionally include one or more of the following features. The transforming optionally includes determining at least one linear transformation and at least one dichotomous transformation. A value of the transformed code is one of a plurality of unique transformed code values; and the transforming is performed such that the distribution of results is arranged so that approximately equal numbers of specific results of the analog compute-in-memory are represented by each unique transformed code value of the plurality of unique transformed code values. The transforming optionally includes determining a plurality of linear transformations and one dichotomous transformation. Implementations of the described techniques optionally include hardware, a method or process, and/or computer software on a computer-accessible medium.

A third aspect includes a transform circuit configured to receive one or more codes from corresponding one or more analog-to-digital converters of an analog compute-in-memory; to provide, responsive to receipt of the one or more codes, one or more transformed codes to digital circuitry; and to determine the one or more transformed codes in accordance with a distribution of results of the analog compute-in-memory, and where each of the one or more transformed codes has a respective value that is one of a plurality of unique transformed code values. The determining is performed such that the distribution of results is arranged so that approximately equal numbers of specific results of the analog compute-in-memory are represented by each unique transformed code value of the plurality of unique transformed code values. Variations of this aspect include corresponding computer systems, apparatus, and computer programs recorded on one or more computer storage devices, each configured to perform actions of the aspects.

Aspects optionally include one or more of the following features. The determining is further performed in accordance with a plurality of linear transformations and a dichotomous transformation. One or more codes are each of a first length, the one or more transformed codes are each of a second length, and the first length is less than the second length. Implementations of the described techniques optionally include hardware, a method or process, and/or computer software on a computer-accessible medium.

Other aspects and advantages of the present invention can be seen on review of the drawings, the detailed description and the claims, which follow.

BRIEF DESCRIPTION OF THE DRAWINGS

FIG. 1 illustrates a portion of an example NN that uses an aCIM to perform (accelerated) MAC operations.

FIG. 2 illustrates a portion of an example NN that uses a digital multiply accumulator to perform MAC operations.

FIG. 3 illustrates an example distribution of results of MAC operations, such as in a context of an NN.

FIG. 9 illustrates an example code transformation table in accordance with the transformation technique illustrated in FIG. 8.

DETAILED DESCRIPTION

Figure 4:
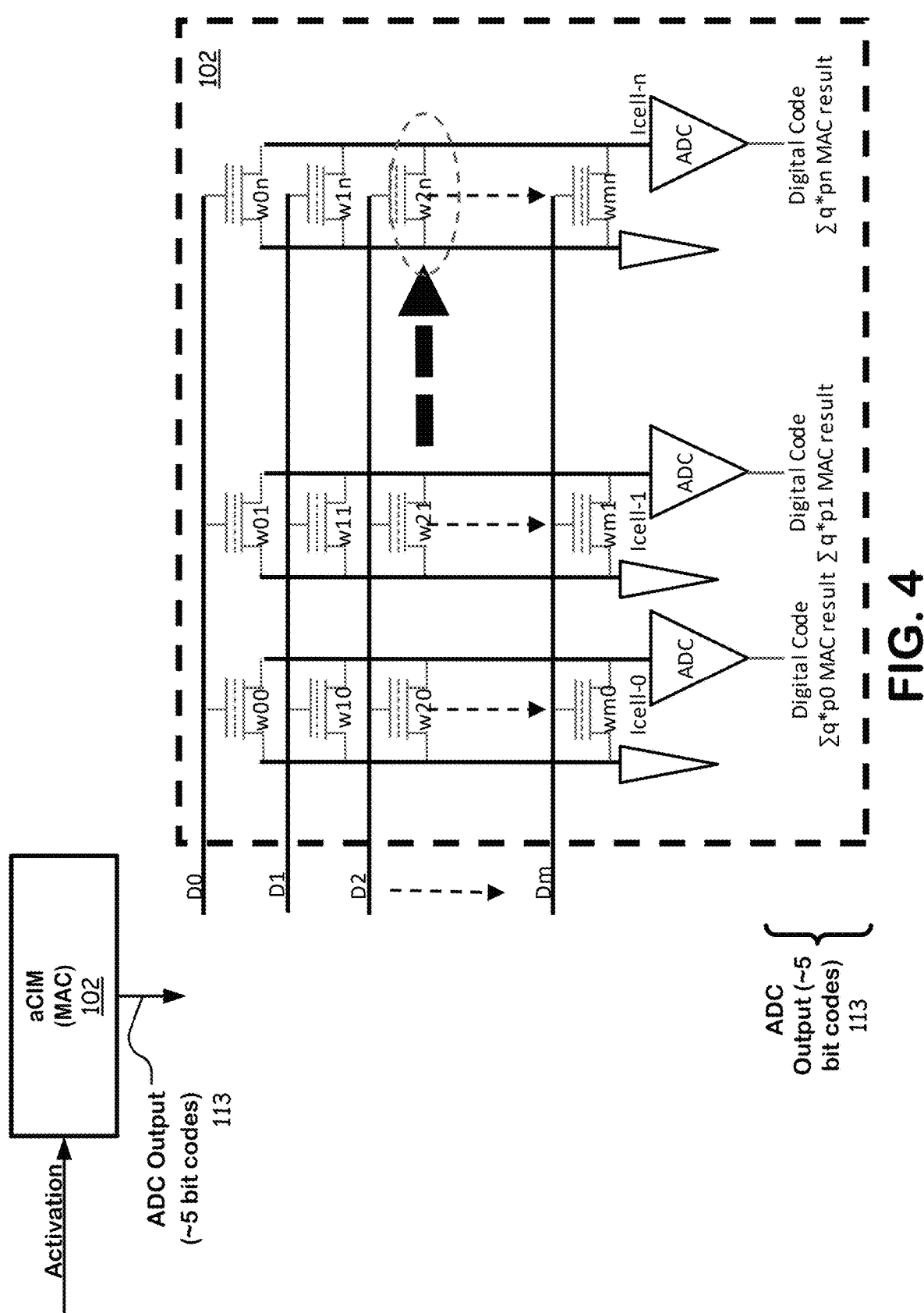
FIG. 4 illustrates selected details of an example aCIM implementation.

A detailed description of embodiments of the present invention is provided with reference to the FIGS. 1-11.

FIG. 1 illustrates a portion of an example NN that uses an aCIM to perform (accelerated) MAC operations.

Specifically, FIG. 1 illustrates a portion of NN 100 (such as implemented in an integrated circuit device). NN 100 includes Digital Op (pre) 101, aCIM (MAC) 102, and Digital Op (post) 103. Digital Op (pre) 101 is configured to receive NN Input 111 (such as one or more digital signals, representing, e.g., scalars, vectors, and/or tensors) and further configured to perform one or more digital operations on NN Input 111, wherein the digital operations precede operations performed by aCIM (MAC) 102. In turn, aCIM (MAC) 102 is configured to receive information from Digital Op (pre) 101 and to perform one or more (accelerated) analog compute-in-memory operations on the received information (such as one or more MAC operations accelerated by analog computation) and in accordance with information stored in aCIM (MAC) 102 (such as weights). The aCIM (MAC) 102 element is further configured to convert one or more analog results of the analog compute-in-memory operations into respective one or more digital results provided as one or more respective multi-bit (e.g., 5-bit) digital codes as ~5 Bit Codes 113. In turn, Digital Op (post) 103 is configured to receive ~5 Bit Codes 113 and to perform one or more digital operations thereupon, wherein the digital operations follow operations performed by aCIM (MAC) 102. Digital Op (post) 103 is further configured to provide one or more digital results (such as one or more digital signals, representing, e.g., scalars, vectors, and/or tensors) as NN Output 114.

However, the information provided via ~5 Bit Codes 113 is relatively low resolution (e.g., five bits), such as compared to an implementation using a digital technique to perform the one or more MAC operations using a digital multiply accumulator. For example, a comparative digital technique could be 12 bits per value (using similar activation and weight data formats as aCIM (MAC) 102), versus 5 bits per value provided by ~5 Bit Codes 113.

FIG. 2 illustrates a portion of an example NN that uses a digital multiply accumulator to perform MAC operations.

Specifically, NN 200 of FIG. 2 is conceptually similar to NN 100 of FIG. 1, except that instead of an aCIM to perform (accelerated) analog MAC operations resulting in 5-bit codes, FIG. 2 uses Digital (MAC) 202 to perform digital MAC operations resulting in 12-bits codes as ~12 Bit Codes 213.

The illustrated portion of NN 200 (such as implemented in an integrated circuit device) includes Digital Op (pre) 201, Digital (MAC) 202, and Digital Op (post) 203. Digital Op (pre) 201 is configured to receive NN Input 211 (such as one or more digital signals, representing, e.g., scalars, vectors, and/or tensors) and further configured to perform one or more digital operations on NN Input 211, wherein the digital operations precede operations performed by Digital (MAC) 202. In turn, Digital (MAC) 202 is configured to receive information from Digital Op (pre) 201 and to perform one or more digital MAC operations and in accordance with information stored in Digital (MAC) 202 (such as weights). Digital (MAC) 202 is further configured to provide respective one or more digital results as one or more respective multi-bit (e.g., 12-bit) digital codes as ~12 Bit Codes 213. In turn, Digital Op (post) 203 is configured to receive ~12 Bit Codes 213 and to perform one or more digital operations thereupon, wherein the digital operations follow operations performed by Digital (MAC) 202. Digital Op (post) 203 is further configured to provide one or more digital results (such as one or more digital signals, representing, e.g., scalars, vectors, and/or tensors) as NN Output 214. Therefore, there is a need for an aCIM or circuitry operable in conjunction with an aCIM, that provides, for example, information having a resolution that is higher than 5 bits, such as that of the ~12 Bit Codes 213 provided by the Digital (MAC) 202.

The information provided via ~12 Bit Codes 213 is relatively high resolution (e.g., 12 bits), such as compared to the implementation using an analog technique to perform the one or more MAC operations (as illustrated in FIG. 1). However, the digital MAC implementation of FIG. 2 is, in some scenarios, slower and/or higher power that the analog MAC implementation of FIG. 1.

FIG. 3 illustrates an example distribution of results of MAC operations, such as in a context of an NN.

Specifically, FIG. 3 illustrates the example distribution of results of MAC operations (x axis representing values of MAC results) on a log scale, centered at the result value 0, as a normal distribution. Regardless of whether an aCIM or a digital MAC is implemented, the distribution the MAC results can follow the example distribution of FIG. 3.

FIG. 4 illustrates selected details of an example aCIM implementation.

Specifically, FIG. 4 illustrates, in the upper-left corner of the figure, aCIM (MAC) 102 in an example usage context, and in the remainder of the figure, selected internal details of aCIM (MAC) 102. In the example usage context, aCIM (MAC) 102 receives activation information and performs an analog MAC operation using the received activation information and stored weight information. In the example implementation, aCIM (MAC) 102 receives the activation information on inputs D0, D1, D2 . . . . Dm as word lines for corresponding rows of an array of non-volatile transistors storing respective weight information.

The weight information is conceptually organized in m rows and n columns. A first row of weight information is represented by w00, w01 . . . w0n. A second row of weight information is represented by w10, w11 . . . wln. A third row of weight information is represented by w20, w21 . . . w2$n$. An m-th (and final) row of weight information is represented by wm0, wm1 . . . wmn). A first column of weight information is represented by w00, w10, w20 . . . wm0. A second column of weight information is represented by w01, w11, w21 . . . wm1. An n-th (and final) column of weight information is represented by w0n, w1n, w2$n$ . . . wmn.

Each column of weight information is used to perform a MAC operation of the activation information provided on D0, D1, D2 . . . . Dm and the stored weight information of the respective column. A resultant current, e.g., Icell-0 for the first column, Icell-1 for the second column . . . Icell-n for the nth (and final) column is sensed by respective ADCs to produce respective digital codes. Collectively the respective digital codes are provided as ~5 Bit Codes 113. The resultant currents are linear with respect to MAC operations performed by aCIM (MAC) 102, and the ADCs preserve the linearity.

Figure 5:
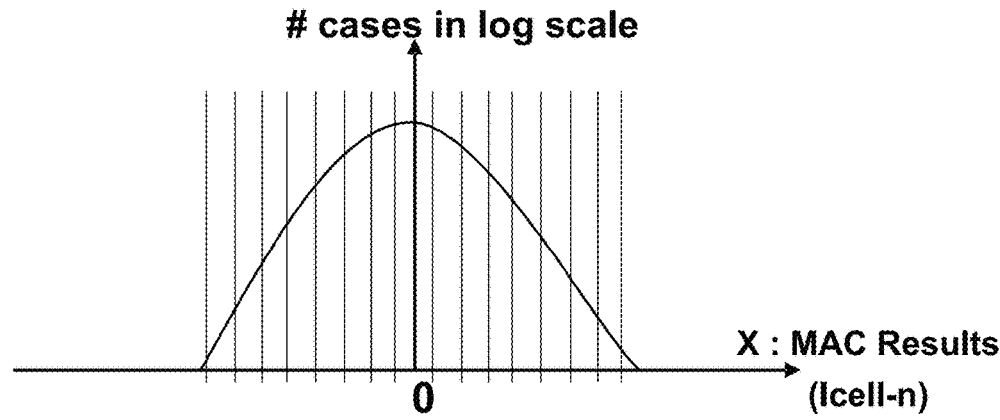
FIG. 5 illustrates an example linear partitioning of results of MAC operations into segments.

FIG. 5 illustrates an example linear partitioning of results of MAC operations into segments.

Specifically, FIG. 5 illustrates an example linear partitioning of results of MAC operations into segments on a log scale, centered at the result value of 0 (as in FIG. 3). Each segment is equal in size, representing a same differential amount of current sensed in a column (e.g., as Icell-0, Icell-1 . . . . Icell-n of FIG. 4). In an example of linear partitioning with 12 bits per digital MAC output, the distribution is partitioned into $2^{\wedge}12$ equal-sized segments. In an example of linear partitioning with 5 bits per ADC output, the distribution is partitioned into $2^{\wedge}5$ equal-sized segments. As evidenced by the distribution of FIG. 3, relatively more MAC operation results are clustered near zero than far from zero, and the clustering is greater the closer to zero the results are. In some scenarios, it is advantageous for each segment represented by a respective digital code to cover a same number of MAC operation results. Therefore, it is advantageous in these scenarios to arrange for non-linear partitioning, such that segments relatively near zero cover a relatively smaller range of values, and segments relatively far from zero cover a relatively larger range of values.

For example, a digital MAC providing codes of 12 bits in length enables partitioning the distribution into $2^{\wedge}12$ segments. For another example, an aCIM with an ADC providing codes of 5 bits in length enables partitioning the distribution into $2^{\wedge}5$ segments. If the digital MAC $2^{\wedge}12$ segments are partitioned linearly, and the aCIM $2^{\wedge}5$ segments are partitioned linearly, then the resolution of the aCIM is lower than the digital MAC. If the aCIM $2^{\wedge}5$ segments are partitioned non-linearly, then the resolution of the aCIM is higher than if the $2^{\wedge}5$ segments are partitioned linearly.

Figure 6:
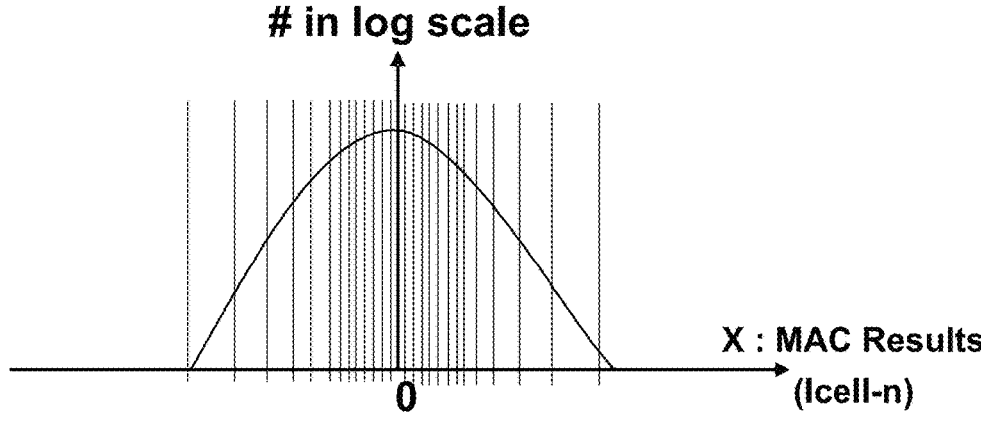
FIG. 6 illustrates an example non-linear partitioning of results of MAC operations into segments based on a distribution of results of MAC operations.

FIG. 6 illustrates an example non-linear partitioning of results of MAC operations into segments based on a distribution of results of MAC operations.

Specifically, FIG. 6 illustrates an example non-linear partitioning of results of MAC operations into segments based on a distribution of results of MAC operations on a log scale, centered at the result value of 0 (as in FIG. 3). Higher resolution is available at lower values (e.g., lower sensed currents Icell-0, Icell-1 . . . . Icell-n of FIG. 4). Lower resolution is available at higher values. The resolution varies to match the distribution of results of MAC operations. For example, the segments are arranged so that an approximately equal number of MAC operation results are within each segment. For another example, the segments are arranged so that relatively higher resolution (e.g., smaller segments) is used for Icell-n currents that are relatively smaller, and relatively lower resolution (e.g., larger segments) is used for Icell-n currents that are relatively larger.

To obtain the example non-linear partitioning of results of MAC operations into segments as illustrated in FIG. 6, a transformation is performed on the results of the ADCs of aCIM (MAC) 102 to transform the 5-bit results into longer linear digital codes, e.g., usable by a following digital operation. Each of the resultant longer linear digital codes represents MAC operation results within each respective segment. Thus, each of the resultant longer linear digital codes represents an approximately equal number of the MAC operation results, such that the narrower segments that are closer to 0 on the x axis have a same or similar number of MAC results as the larger segments located at the far left or far right of the center of the distribution curve.

Figure 7:
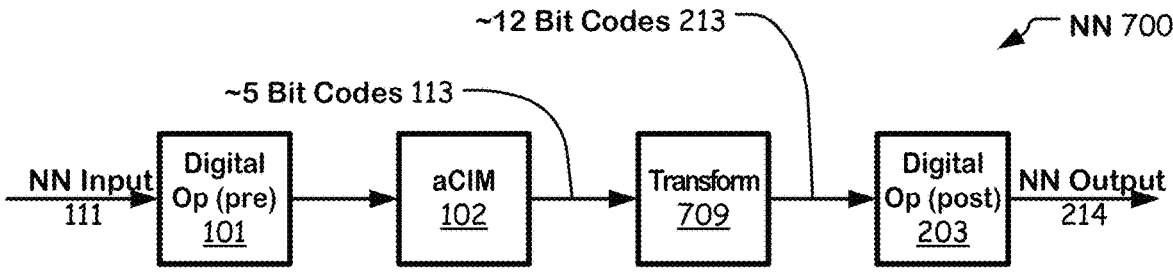
FIG. 7 illustrates a portion of an example NN that uses an aCIM to perform (accelerated) MAC operations and transforms results for following higher effective resolution digital computations.

FIG. 7 illustrates a portion of an example NN that uses an aCIM to perform (accelerated) MAC operations and transforms results for following higher effective resolution digital computations.

Specifically, FIG. 7 illustrates a portion of NN 700 (such as implemented in an integrated circuit device) that includes Digital Op (pre) 101, aCIM (MAC) 102, Transform 709, and Digital Op (post) 203. Like numbered elements of FIG. 7 are identical to or similar to corresponding elements of FIG. 1 and FIG. 2 and are not further described here.

Transform 709 is configured to perform a non-linear partitioning of results of the MAC operations (e.g., from ADC outputs) into segments (e.g., as transformed outputs) so that an approximately equal number of MAC operation results are within each segment, thereby enabling higher effective resolution data for following digital processing. Conceptually, Transform 709 receives information encoded according to a first number system and transforms the information as encoded according to a second number system. The first number system corresponds to information as provided by ~5 Bit Codes 113. The second number system corresponds to information as provided by ~12 Bit Codes 213. Each of the first and the second number systems has discrete points and respective distances between the discrete points. Transform 709 operates to vary the respective distances between discrete points in the first number system compared to the respective distances in the second number system. For example, discrete points near 0 in the first number system are transformed into respective discrete points in the second number system that are "crowded together" and discrete points far from 0 in the first number system are transformed into respective discrete points in the second number system that are "spread apart".

In operation, Transform 709 transforms ~5 Bit Codes 113 from ADCs of aCIM (MAC) 102 into ~12 Bit Codes 213 that corresponds to a data format requirement for Digital Op (post) 203. The transformation aligns the partitioning of currents sensed by the ADCs of aCIM (MAC) 102 (e.g., Icell-0, Icell-1 . . . . Icell-n of FIG. 4) while retaining a linear relationship between the currents, thus providing respective 12-bit codes for following digital operations such as performed by Digital Op (post) 203. The transformation preserves the linearity of the MAC operations performed by aCIM (MAC) 102, including the ADCs, so that the transformation does not distort the linearity of aCIM (MAC) 102, as operations (e.g., digital arithmetic operations) performed by Digital Op (post) 203 optionally rely on the linearity. The transformation maintains the linearity of the MAC operations performed by aCIM (MAC) 102, including the ADCs, while transforming a relatively short code (e.g., 5 bits) into a relatively longer code (e.g., 12 bits). Transform 709 is further configured to receive ADC outputs (5 bit codes) as ~5 Bit Codes 113. Transform 709 is further configured to provide transformed outputs (12 bit codes) as ~12 Bit Codes 213.

As an example, Transform 709 includes one or more circuit blocks, such as a plurality of logic gates, to receive ~5 Bit Codes 113, to perform transformations on respective codes, and to provide ~12 Bit Codes 213.

Transform 709 is implementable according to several techniques. A first technique uses a linear transformation for low values and a dichotomous transformation for high values, as described with respect to FIG. 8 and FIG. 9, following. A second technique uses a plurality of linear transformations for low values and a dichotomous transformation for high values, as described with respect to FIG. 10 and FIG. 11, as described below.

Figure 8:
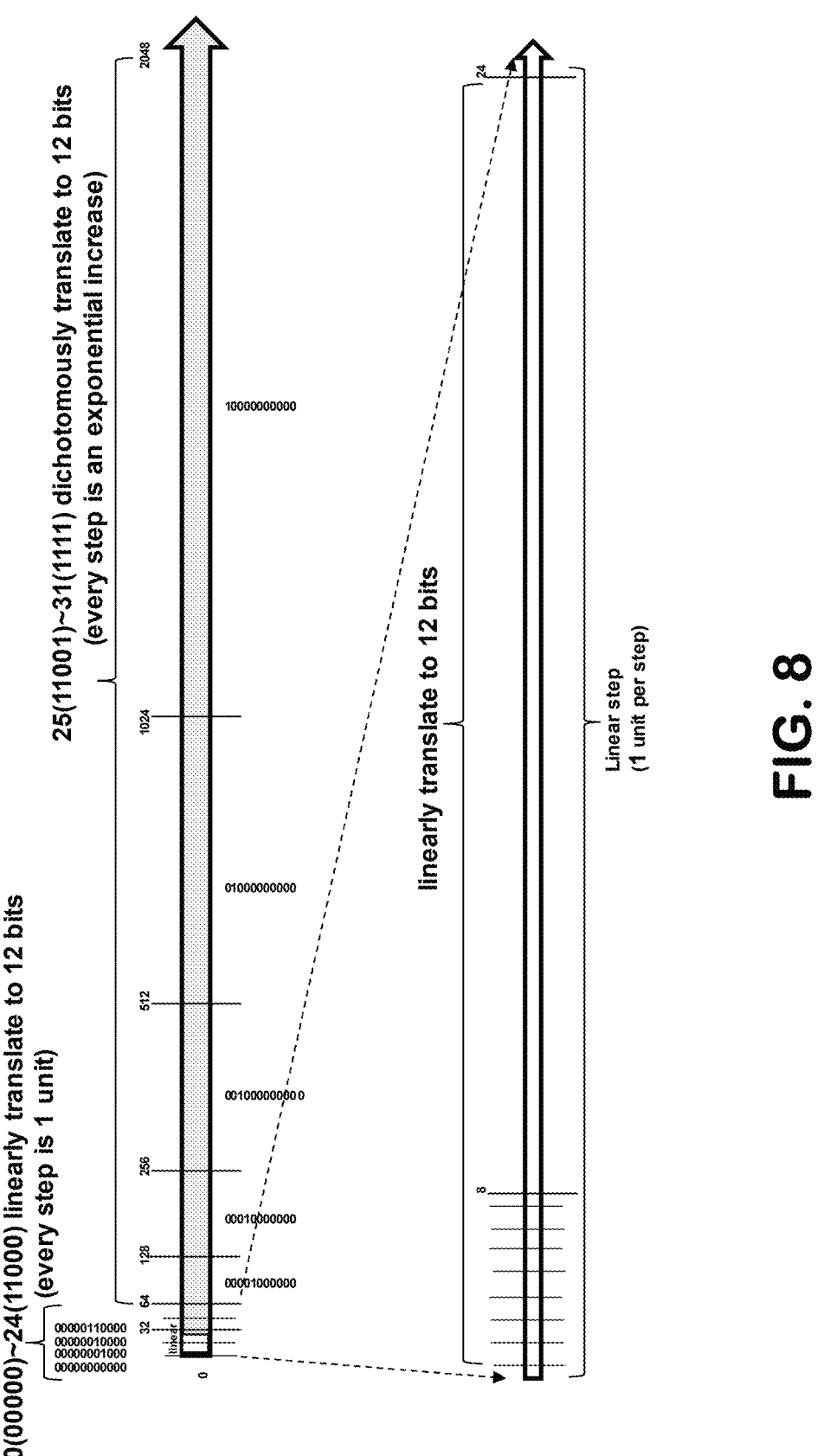
FIG. 8 illustrates concepts associated with a first transform technique that uses a linear transformation for low code values and a dichotomous transformation for high code values.

FIG. 8 illustrates concepts associated with a first transform technique that uses a linear transformation for low code values and a dichotomous transformation for high code values.

Specifically, FIG. 8 illustrates a linear transformation for low code values, e.g., code values from 0 (encoded in 5-bit binary as 00000) to 24 (encoded in 5-bit binary as 11000) and a dichotomous transformation for high code values, e.g., code values from 25 (encoded in 5-bit binary as 11001) to 31 (encoded in 5-bit binary as 11111). The low code values and high code values can be identified using values other than those identified above. For example, low code values could range from 0 to 16 and high code values could range from 17 to 31. The linear transformation is performed so that in a context of a first number system corresponding to the code values to be transformed and a second number system corresponding to results of the linear transformation, every distance (termed a "step") between adjacent discrete points of the first number system corresponds to a same distance (termed a "unit") between the transformed points of the second number system. The dichotomous transformation is performed so that every step between code values corresponds to an exponential increase in units.

FIG. 9 illustrates an example code transformation table in accordance with the transformation technique illustrated in FIG. 8.

Specifically, FIG. 9 illustrates an example code transformation table in accordance with a linear transformation for low code values and a dichotomous transformation for high code values as illustrated in FIG. 8. Column 5-bit Value 901 indicates the value corresponding to the code of column 5-bit ADC Code 902. Column 12-bit Transformed Code 903 indicates the transformed code provided responsive to the code of column 5-bit ADC Code 902. Column 12-bit Value 904 indicates the value corresponding to the code of column 12-bit Transformed Code 903. Rows Linear 910 correspond to linear transformations of 5-bit ADC Code 902 to 12-bit Transformed Code 903. Rows Dichotomous 920 correspond to dichotomous transformations of 5-bit ADC Code 902 to 12-bit Transformed Code 903.

As a specific example, 5-bit ADC code 10000 (having a corresponding value of 16) is transformed into 12-bit transformed code 0000_0001_0000 (having a corresponding value of 16). As another specific example, 5-bit ADC code 11000 (having a corresponding value of 24) is transformed into 12-bit transformed code 0000_0001_1000 (have a corresponding value of 24). As another specific example, 5-bit ADC code 11001 (having a corresponding value of 25) is transformed into 12-bit transformed code 0000_0010_0000 (have a corresponding value of 32).

Figure 10:
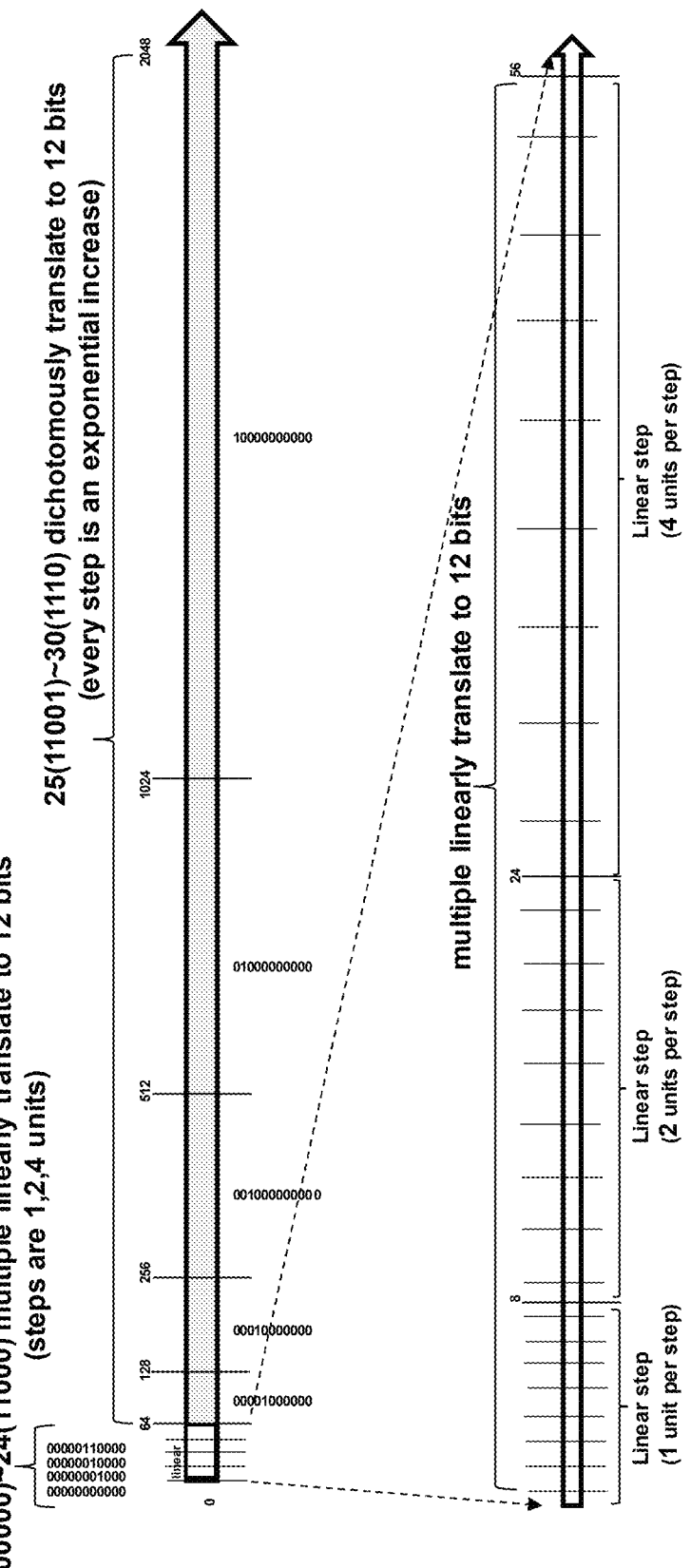
FIG. 10 illustrates concepts associated with a second transform technique that uses a plurality of linear transformations for low code values and a dichotomous transformation for high code values.

FIG. 10 illustrates concepts associated with a second transform technique that uses a plurality of linear transformations for low code values and a dichotomous transformation for high code values.

Specifically, FIG. 10 illustrates a plurality of different linear transformations for low code values, e.g., code values from 0 (encoded in 5-bit binary as 00000) to 24 (encoded in 5-bit binary as 11000) and a dichotomous transformation for high code values, e.g., code values from 25 (encoded in 5-bit binary as 11001) to 30 (encoded in 5-bit binary as 11110). Optionally, the dichotomous transformation for high code values includes a transformation for code value 31 (encoded in 5-bit binary as 11111) to a maximum value of 2048, identical to the transformation for code value 30. The low code values and high code values can be identified using values other than those identified above. For example, low code values could range from 0 to 16 and high code values could range from 17 to 31. The linear transformations are performed so that every step between code values corresponds to either one, two, or four units, in dependence on the low code value that is between 0 and 24, inclusive. Specifically, for example, code values from 0 to 8 are transformed linearly so that every step between code values corresponds to one unit. Code values from 9 to 16 are transformed linearly so that every step between code values corresponds to two units. Code values from 17 to 24 are transformed linearly so that every step between code values corresponds to four units. The code values that correspond to the one, two, or four unit increments can be adjusted. The dichotomous transformation is performed so that every step between code values corresponds to an exponential increase.

Figure 11:
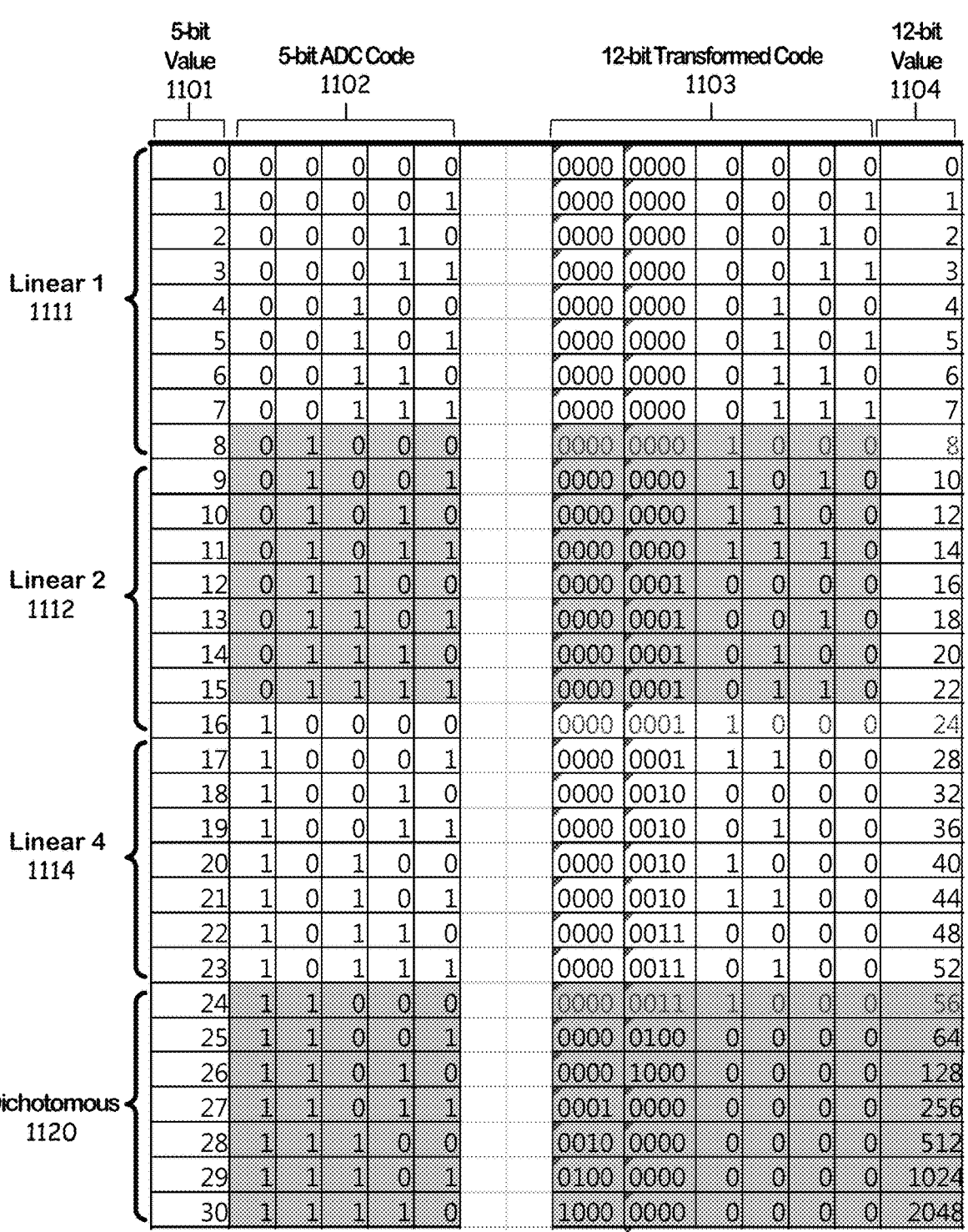
FIG. 11 illustrates an example code transformation table in accordance with the transformation technique illustrated in FIG. 10.

FIG. 11 illustrates an example code transformation table in accordance with the transformation technique illustrated in FIG. 10.

Specifically, FIG. 11 illustrates an example code transformation table in accordance with a plurality of linear transformations for low code values and a dichotomous transformation for high code values as illustrated in FIG. 10. Column 5-bit Value 1101 indicates the value corresponding to the code of column 5-bit ADC Code 1102. Column 12-bit Transformed Code 1103 indicates the transformed code provided responsive to the code of column 5-bit ADC Code 1102. Column 12-bit Value 1104 indicates the value corresponding to the code of column 12-bit Transformed Code 1103.

Rows Linear 1 1111 correspond to linear transformations of 5-bit ADC Code 1102 to 12-bit Transformed Code 1103 for a first linear region where each step of 5-bit ADC Code 1102 is transformed in accordance with one unit of 12-bit Transformed Code 1103. Rows Linear 2 1112 correspond to linear transformations of 5-bit ADC Code 1102 to 12-bit Transformed Code 1103 for a second linear region where each step of 5-bit ADC Code 1102 is transformed in accordance with two units of 12-bit Transformed Code 1103. Rows Linear 4 1112 correspond to linear transformations of 5-bit ADC Code 1102 to 12-bit Transformed Code 1103 for a third linear region where each step of 5-bit ADC Code 1102 is transformed in accordance with four units of 12-bit Transformed Code 1103. Rows Dichotomous 920 correspond to dichotomous transformations of 5-bit ADC Code 902 to 12-bit Transformed Code 903.

As a specific example, 5-bit ADC code 1000 (having a corresponding value of 16) is transformed into 12-bit transformed code 0000_0001_1000 (have a corresponding value of 24). As another specific example, 5-bit ADC code 11000 (having a corresponding value of 24) is transformed into 12-bit transformed code 0000_0011_1000 (have a corresponding value of 56). As another specific example, 5-bit ADC code 11001 (having a corresponding value of 25) is transformed into 12-bit transformed code 0000_0100_0000 (have a corresponding value of 64).

The example code transformations illustrated in FIG. 9 or alternatively FIG. 11 are suitable as a specification for implementing transformations performed by Transform 709 of FIG. 7. For example, Transform 709 is implemented as a look-up table in accordance with FIG. 9 or alternatively FIG. 11. For another example, Transform 709 is implemented as logic gates that transform inputs to outputs in accordance with FIG. 9 or alternatively FIG. 11.

The linear and dichotomous transformations (such as with respect to FIG. 8 and FIG. 10) are merely examples of non-linear transformations that improve effective resolution for aCIM outputs that are used in subsequent digital operations. Other techniques for a non-linear transformation between aCIM outputs (e.g., from ADCs) are usable.

The foregoing examples are with respect to selected operating contexts. However, any operating context with aCIM type structure, such as having one or more ADCs, is a suitable operating context. The foregoing examples are with respect to ADC outputs of five bits in length. However, other ADC output lengths are usable, such as four bits or six bits. The foregoing examples are with respect to transforming ADC outputs to codes of 12 bits in length. However, other code lengths are usable, such as 11 bits or 16 bits.

The foregoing examples are with respect to aCIM elements operating in, e.g., a NN. Other examples using the linear and dichotomous transformations (such as with respect to FIG. 8 and FIG. 10) include any application benefiting from a non-linear transformation of, e.g., an ADC output code into a longer code, such as to obtain improved resolution for, e.g., raw data analysis.

Other implementations of techniques described herein can include a non-transitory computer readable storage medium storing instructions executable by a processor to perform any of the techniques described above. Yet another implementation of the techniques described in this section can include a system including memory and one or more processors operable to execute instructions, stored in the memory, to perform any of the techniques described herein.

Any data structures and code described or referenced herein are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

A number of illustrations described herein reflect logic executed by a memory controller or by a memory device. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An analog-to-digital converter system, comprising:
an analog compute-in-memory; and
transform circuitry,
wherein the transform circuitry is (i) configured to receive one or more codes from corresponding one or more analog-to-digital converters of the analog compute-in-memory, (ii) configured to provide, responsive to receipt of the one or more codes, one or more transformed codes to digital circuitry configured to perform one or more digital operations on the one or more transformed codes, and (iii) configured to determine the one or more transformed codes in accordance with a distribution of results of the analog compute-in-memory, and
wherein the one or more codes are each of a first length, the one or more transformed codes are each of a second length, and the first length is less than the second length.

2. The analog-to-digital converter system of claim 1, wherein the determining of the one or more transformed codes is in accordance with at least a first type of linear transformation and a dichotomous transformation.

3. The analog-to-digital converter system of claim 2, wherein:
the at least a first type of linear transformation is used for a first portion of the one or more codes;
the dichotomous transformation is used for a second portion of the one or more codes;
the first and the second portions of the one or more codes are non-overlapping; and
values of the first portion of the one or more codes are less than values of the second portion of the one or more codes.

4. The analog-to-digital converter system of claim 2, wherein the determining of the one or more transformed codes is in accordance with the at least a first type of linear transformation and at least a second type of linear transformation, which is different than the first type of linear transformation.

5. The analog-to-digital converter system of claim 1, wherein the analog compute-in-memory is configured to store a plurality of weights and to compute a multiply accumulate calculation based on one or more activation inputs and the stored plurality of weights.

6. The analog-to-digital converter system of claim 1, wherein the transform circuitry comprises a look-up table.

7. The analog-to-digital converter system of claim 1, wherein the transform circuitry comprises logic gates.

8. The analog-to-digital converter system of claim 1, wherein the determining of the one or more transformed codes in accordance with the distribution of the results of the analog compute-in-memory is performed such that the distribution of results is arranged so that approximately equal numbers of specific results of the analog compute-in-memory are represented by each of the one or more transformed codes.

9. The analog-to-digital converter system of claim 1, wherein the determining of the one or more transformed codes is in accordance with at least a dichotomous transformation.

10. The analog-to-digital converter system of claim 1, wherein the determining the one or more transformed codes is in accordance with first a linear transformation such that a distance between adjacent discrete points of a first number system corresponding to the one or more codes corresponds to a distance between adjacent discrete points of a second number system corresponding to the one or more transformed codes.

11. The analog-to-digital converter system of claim 10, wherein the determining the one or more transformed codes is further in accordance with a second linear transformation such that the distance between adjacent discrete points of the first number system corresponds to twice the distance between adjacent discrete points of the second number system.

12. The analog-to-digital converter system of claim 11, wherein the determining the one or more transformed codes is further in accordance with a third linear transformation such that the distance between adjacent discrete points of the first number system corresponds to four times the distance between adjacent discrete points of the second number system.

13. The analog-to-digital converter system of claim 12, wherein the determining the one or more transformed codes is further in accordance with a dichotomous transformation such that each unit in the one or more codes corresponds to respective exponential steps in the one or more transformed codes.

14. A method comprising:
receiving a code from an analog-to-digital converter of an analog compute-in-memory; and
transforming the received code into a transformed code, wherein the transforming is in accordance with a distribution of results of the analog compute-in-memory, and wherein the transforming comprises determining and at least one dichotomous transformation.

15. The method of claim 14, wherein the received code is of a first length that is less than a second length, and the transformed code is of the second length.

16. The method of claim 15, wherein:
a value of the transformed code is one of a plurality of unique transformed code values; and
the transforming is performed such that the distribution of results is arranged so that approximately equal numbers of specific results of the analog compute-in-memory are represented by each unique transformed code value of the plurality of unique transformed code values.

17. The method of claim 14, wherein the transforming comprises determining a plurality of linear transformations and one dichotomous transformation.

18. A transform circuit configured:
to receive one or more codes from corresponding one or more analog-to-digital converters of an analog compute-in-memory;
to provide, responsive to receipt of the one or more codes, one or more transformed codes to digital circuitry; and
to determine the one or more transformed codes in accordance with a distribution of results of the analog compute-in-memory, and
wherein each of the one or more transformed codes has a respective value that is one of a plurality of unique transformed code values, and
the determining is performed such that the distribution of results is arranged so that approximately equal numbers of specific results of the analog compute-in-memory are represented by each unique transformed code value of the plurality of unique transformed code values.

19. The transform circuit of claim 18, wherein the determining is further performed in accordance with a plurality of linear transformations and a dichotomous transformation.

20. The transform circuit of claim 18, wherein:

the one or more codes are each of a first length, the one or more transformed codes are each of a second length, and the first length is less than the second length.

\*　\*　\*　\*　\*